(12) United States Patent
Willwerth et al.

(10) Patent No.: US 10,490,435 B2
(45) Date of Patent: Nov. 26, 2019

(54) COOLING ELEMENT FOR AN ELECTROSTATIC CHUCK ASSEMBLY

(71) Applicant: Applied Materials, Inc., Santa Clara, CA (US)

(72) Inventors: Michael D. Willwerth, Campbell, CA (US); Roberto Cesar Cotlear, Sunnyvale, CA (US); Andreas Schmid, Meyriez (CH)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 15/890,946

(22) Filed: Feb. 7, 2018

(65) Prior Publication Data
US 2019/0244848 A1  Aug. 8, 2019

(51) Int. Cl.
| H01L 21/683 | (2006.01) |
| H01L 23/473 | (2006.01) |
| H01L 23/467 | (2006.01) |
| H01L 21/67 | (2006.01) |

(52) U.S. Cl.
CPC .... *H01L 21/6833* (2013.01); *H01L 21/67103* (2013.01); *H01L 21/67109* (2013.01); *H01L 21/6831* (2013.01); *H01L 23/467* (2013.01); *H01L 23/473* (2013.01); *Y10T 279/23* (2015.01)

(58) Field of Classification Search
CPC . H01L 21/467; H01L 21/473; H01L 21/6831; H01L 21/6833; Y10T 279/23
See application file for complete search history.

(56) References Cited

U.S. PATENT DOCUMENTS

| 6,310,755 | B1 * | 10/2001 | Kholodenko | C04B 35/185 361/115 |
| 7,672,111 | B2 * | 3/2010 | Miyaji | H01L 21/6831 361/234 |
| 8,284,538 | B2 * | 10/2012 | Himori | H01L 21/6833 361/234 |
| 8,313,664 | B2 * | 11/2012 | Chen | H01J 37/32082 216/59 |
| 8,542,474 | B2 * | 9/2013 | Yonekura | H01L 21/6833 118/725 |
| 9,287,156 | B2 * | 3/2016 | Moriya | H01L 21/6833 |
| 9,589,823 | B2 * | 3/2017 | Sasaki | H01L 21/6831 |
| 10,026,634 | B2 * | 7/2018 | Takada | H01L 21/6831 |
| 10,153,138 | B2 * | 12/2018 | Aoto | H01L 21/6831 |
| 10,249,526 | B2 * | 4/2019 | Parkhe | H01L 21/67109 |
| 10,283,382 | B2 * | 5/2019 | Noh | H01L 21/6831 |
| 2004/0115947 | A1 | 6/2004 | Fink et al. | |

(Continued)

*Primary Examiner* — Eric A. Gates

(74) *Attorney, Agent, or Firm* — Patterson + Sheridan, LLP

(57) ABSTRACT

An electrostatic chuck assembly with improved thermal uniformity and stability is disclosed herein. The electrostatic chuck assembly includes a puck having a chucking electrode disposed therein and a cooling base connected to the puck. The cooling base is formed a first material and includes a top surface, a first cooling channel, a second cooling channel configured to flow coolant therethrough independent of flow through the first cooling channel, and a first thermal spreading element aligned with the first cooling channel and disposed between the first cooling channel and the puck. The first thermal spreading element is formed from a second material that has a thermal conductivity higher than a thermal conductivity of the first material.

18 Claims, 6 Drawing Sheets

(56) References Cited

U.S. PATENT DOCUMENTS

| | | | |
|---|---|---|---|
| 2007/0139856 A1 | 6/2007 | Holland et al. | |
| 2007/0283891 A1* | 12/2007 | Okayama | C23C 16/4586 |
| | | | 118/728 |
| 2008/0017104 A1 | 1/2008 | Matyushkin et al. | |
| 2008/0173237 A1* | 7/2008 | Collins | H01J 37/32412 |
| | | | 118/723 I |
| 2010/0271745 A1* | 10/2010 | Chen | H01L 21/6831 |
| | | | 361/234 |
| 2014/0069585 A1* | 3/2014 | Aoto | H01L 21/6831 |
| | | | 156/345.52 |
| 2017/0186641 A1* | 6/2017 | Horiuchi | G03F 7/70708 |
| 2018/0204757 A1 | 7/2018 | Fushimi | |
| 2018/0374737 A1* | 12/2018 | Margavio | H01L 21/67109 |

* cited by examiner

COOLING ELEMENT FOR AN ELECTROSTATIC CHUCK ASSEMBLY

BACKGROUND

Field

Embodiments described herein generally relate to a cooling an electrostatic chuck assembly.

Description of the Related Art

In the semiconductor industry, devices are fabricated by a number of manufacturing processes, such as etching and deposition. Some manufacturing processes expose the substrate that is being processed to high thermal environments. Many current electrostatic chuck assemblies for processing chambers include a cooling base to aid in mitigating thermal effects on the substrate during processing. However, these cooling bases often cannot adequately mitigate uneven temperatures across the substrate, increasing the possibility that the processed substrate with include defects.

Typically, electrostatic chuck assemblies have one or more cooling channels through which a coolant is provided. The cooling channels typically reside with the cooling base that is typically constructed of aluminum. However, the thermal conductivity of the cooling base is not sufficient to provide enough thermal uniformity and thermal stability to the substrate during processing.

Therefore, there is a need for an improved electrostatic chuck assembly.

SUMMARY

An electrostatic chuck assembly with improved thermal uniformity and stability is disclosed herein. The electrostatic chuck assembly includes a puck having a chucking electrode disposed therein and a cooling base connected to the puck. The cooling base is formed a first material and includes a top surface, a first cooling channel, a second cooling channel configured to flow coolant therethrough independent of flow through the first cooling channel, and a first thermal spreading element aligned with the first cooling channel and disposed between the first cooling channel and the puck. The first thermal spreading element is formed from a second material that has a thermal conductivity higher than a thermal conductivity of the first material.

In another embodiment, a semiconductor processing chamber includes an electrostatic chuck assembly disposed in a chamber body. The electrostatic chuck assembly includes a puck having a chucking electrode disposed therein and a cooling base connected to the puck. The cooling base is formed a first material and includes a top surface, a first cooling channel, a second cooling channel configured to flow coolant therethrough independent of flow through the first cooling channel, and a first thermal spreading element aligned with the first cooling channel and disposed between the first cooling channel and the puck. The first thermal spreading element is formed from a second material that has a thermal conductivity higher than a thermal conductivity of the first material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
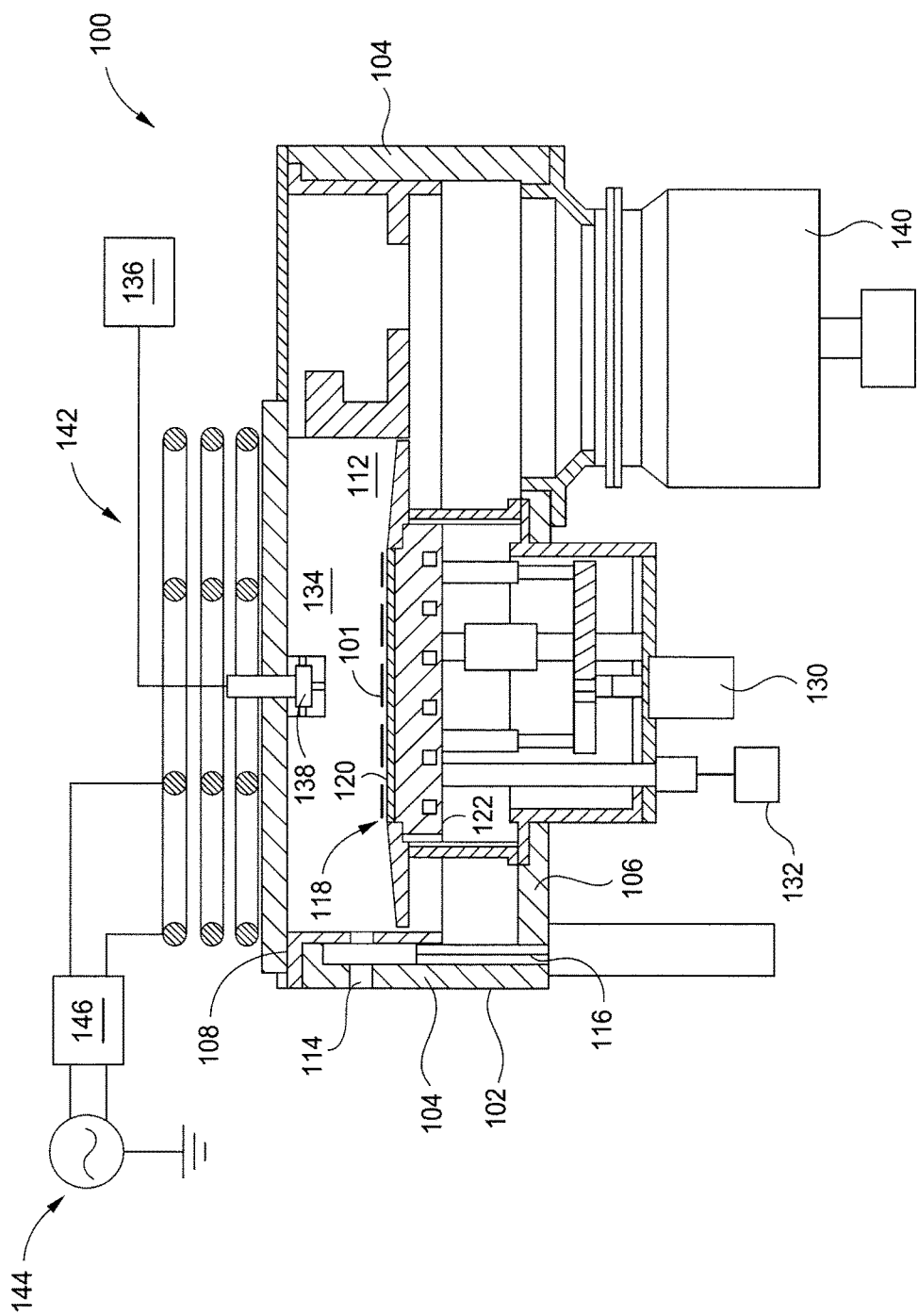
FIG. 1 is a sectional side view illustrating a processing chamber, according to one or more embodiments.

FIG. 1 is a sectional side view illustrating a processing chamber 100. As shown, the processing chamber 100 is an etch chamber, capable of etching a substrate. Examples of processing chambers that may be adapted to benefit from the disclosure are Sym3® Processing Chamber, and Mesa™ Processing Chamber, commercially available from Applied Materials, Inc., located in Santa Clara, Calif. It is contemplated that other processing chambers including those from other manufacturers may be adapted to benefit from the disclosure.

The processing chamber 100 may be used for various plasma processes. In one embodiment, the processing chamber 100 may be used to perform dry etching with one or more etching agents. For example, the processing chamber may be used for generating a plasma from an etchant, such as $C_xF_y$ (where x and y can be different allowed combinations), $O_2$, $NF_3$, or combinations thereof, which is utilized to etch a material disposed on a substrate. Embodiments of the present disclosure may also be used in etching chromium for photomask applications, etching a profile, such as deep trench and through silicon vias (TSV), in a silicon substrate having oxide and metal layers disposed on the substrate 101, among other applications.

The processing chamber 100 includes a chamber body 102 having sidewalls 104, a bottom 106, and a chamber lid 108. The sidewalls 104, bottom 106, and chamber lid 108 define an interior volume 110. The processing chamber 100 further includes a liner 112 disposed in the interior volume 110. The liner 112 is configured to prevent the sidewalls 104 from damage and contamination from the processing chemistry and/or processing by-products. In one embodiment, a slit valve door opening 114 is formed through the sidewall 104. The slit valve door opening 114 is configured to allow passage of substrates and substrate transfer mechanism. A slit valve door 116 selectively opens and closes the slit valve door opening 114.

The processing chamber 100 further includes an electrostatic chuck assembly 118 disposed in the interior volume 110. The electrostatic chuck assembly 118 is movably or fixedly positioned in the processing chamber 100. The electrostatic chuck assembly 118 is configured to support a substrate 101 during processing. The electrostatic chuck assembly 118 includes a chuck body 120 and a chuck base 122. The chuck body 120 and chuck base 122 may define a semiconductor processing chamber component assembly 170. In various embodiments, the electrostatic chuck assembly 118 further includes one or more sealing members. The one or more sealing members may be disposed around the bonding material 124 to protect the bonding material 124 from the processing environment.

The chuck body 120 may include one or more through holes (not shown) formed therethrough. The through holes are configured to allow lift pins 128 to pass therethrough to space the substrate 101 from the surface of the electrostatic chuck assembly 118. A lift 130 is configured to raise and lower lift pins 128 relative to the electrostatic chuck assembly 118 during processing and loading/unloading the substrate 101. The electrostatic chuck assembly 118 may be coupled to a bias power source 132 for generating chucking force to secure the substrate 101 on the electrostatic chuck assembly. In various embodiments, the chuck body 120 includes a puck, a cooling base, one or more insulating layers, and a ground plate.

One or more processing gases, such as an etchant, are supplied to a plasma processing region 134 from a gas source 136 via an inlet 138. The processing chamber 100 further includes a vacuum pump 140 in fluid communication with the plasma processing region 134. The vacuum pump 140 is configured to remove by-products and gases from the plasma processing region 134 and maintain a low pressure environment during processing.

The processing chamber 100 further includes an antenna assembly 142 disposed exterior to the chamber lid 108. The antenna assembly 142 is coupled to a radio-frequency (RF) power source 144 through a matching network 146. During processing, the antenna assembly 142 is energized with RF power provided by the power source 144 to ignite a plasma of processing gases within plasma processing region 134 and to maintain the plasma during processing of the substrate 101.

Figure 2A:
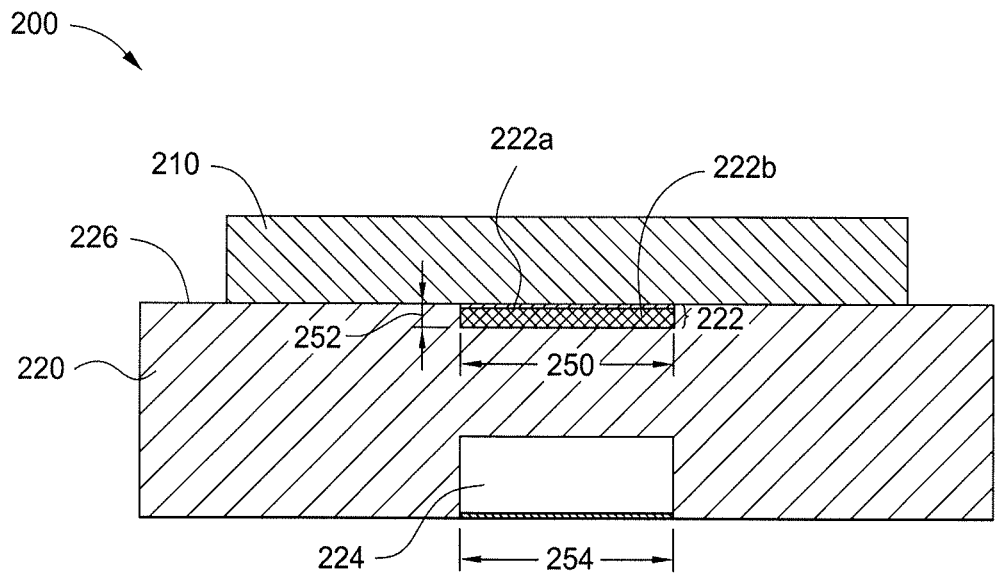
FIG. 2a is a sectional side view of an electrostatic chuck assembly, according to one or more embodiments.

FIG. 2a illustrates electrostatic chuck assembly 200 having a cooling base with one or more layers of a high thermal conductivity material. In the illustrated embodiment, the electrostatic chuck assembly 200 includes a puck 210 and a cooling base 220. While not illustrated, in various embodiments, the electrostatic chuck assembly 200 may have one or more additional layers and/or elements. For example, one or more bonding layers may be disposed between elements of the electrostatic chuck assembly 200 to bond layers to each other. Further, the electrostatic chuck assembly 200 may be disposed on a substrate support.

As illustrated in FIG. 2a, the puck 210 is disposed on the cooling base 220 In one embodiment, the puck 210 is attached to the cooling base 220 through a bond layer.

In one embodiment, the puck 210 includes one or more chucking electrodes and has an upper surface configured to receive a substrate for processing. The chucking electrodes may be disposed within the same or different planes of the puck 210. For example, a first chucking electrode may be disposed on a first dielectric layer and the second chucking electrode may be disposed on a second dielectric layer of the puck 210. In one embodiment, a first chucking electrode and a second chucking electrode are at least partially interleaved with each other. In one or more embodiments, a first voltage is applied to a first chucking electrode and a second voltage is applied to a second chucking electrode to chuck a substrate against the upper surface of the electrostatic chuck assembly 200. The first voltage has an absolute value that is greater than the absolute value of the second voltages. In one embodiment, the first voltage has a positive value and the second voltage has a negative value.

The cooling base 220 generally is used to thermally regulate the temperature of the puck 210 and substrate being processed. For example in the embodiment of FIG. 2a, the cooling base 220 is configured as a heat sink for the puck 210 and the substrate being processed on the puck 210. The ability for the cooling base 220 to perform as a heat sink corresponds to the thermal conductivity. In various embodiments, to increase the thermal conductivity of the cooling base 220, one or more thermal spreading elements (thermal spreading element 222) are included within the cooling base 220. Further, increasing the thermal conductivity of cooing plate 220 also increases the thermal uniformity and thermal stability of the electrostatic chuck assembly 200.

During processing of a substrate, the substrate is heated by plasma within processing region 134 and the cooling base 220 functions as a heat sink to draw heat out of the substrate. During processing, the substrate may be heated by about 1000 W or more. In various embodiments, a coolant is pumped through the cooling channel 224. However, as the coolant flows through the cooling channel, the temperature of the coolant may vary, creating locations within the substrate having different temperatures. For example, the temperature at an input port of the coolant may be about 5 to 10 degrees Celsius below that of the temperature of the coolant at an output port. The coolant may be a gas, liquid or a combination of gas and liquid. Further, in various embodiments, the coolant may be inputted into cooling channel at a temperature of about 20 degrees Celsius to about 30 degrees Celsius.

In one embodiment, thermal spreading elements 222 maybe positioned within the cooling base 220 to reduce or eliminate temperature variations of the coolant and temperature variations of the substrate being processed.

As illustrated in FIG. 2a, the thermal spreading element 222 is disposed between the cooling channel 224 and the puck 210. For example, the thermal spreading element 222 is vertically aligned with the cooling channel 224 and disposed between the cooling channel 224 and a top surface 226 of the cooling base 220. In one embodiment, the thermal spreading element 222 is vertically aligned with the cooling channel 224 in that the thermal spreading element 222 at least partially overlaps cooling channel 224. Further, in another embodiment, the thermal spreading element 222 is vertically aligned with the cooling channel 224 in that the thermal spreading element 222 completely overlaps the cooling channel 224. The thermal spreading element 222 may alternatively be disposed on the top surface 226 of the cooling base 220. The thermal spreading element 222 includes two discrete portions having a material with a higher thermal conductivity than that of the material making up the cooling base 222. The thermal conductivity of the material of the thermal spreading element is in the range of about 1000 W/m-K to about 2000 W/m-K. In one embodiment, the material of the cooling base 222 is aluminum. Further, the material of the thermal spreading element 222 may be a pyrolytic graphite material such as a thermally annealed pyrolytic graphite (TPG).

In various embodiments, the thermal spreading element 222 is vertically aligned with cooling channel 224 such that the thermal spreading element 222 at least partially overlaps the cooling channel 224. Further, in one or more embodiments, the thermal spreading element 222 is aligned with cooling channel 224 such that the thermal spreading element 222 completely overlaps the cooling channel 224. In one embodiment, one end of the thermal spreading element 222 extends beyond a corresponding end of cooling channel 224. In other embodiments, both ends of thermal spreading element 222 extend beyond corresponding ends of cooling channel 224.

In some embodiments, the width (250) of the thermal spreading element 222 is the same as the width (254) of cooling channel 224. In other embodiments, the width (250) of the thermal spreading element 222 is greater than or less than the width (254) of cooling channel 224. In one or more embodiments, the height of thermal spreading element 222 is less than the distance between cooling channel 224 and top surface 226. Further, the height (252) of thermal spreading element 242 may be in the range of 10 microns to 10 millimeter.

In one or more embodiments, the thermal spreading element 222 and the cooling channel 224 have a similar shape. For example, the thermal spreading element 222 and the cooling channel 224 may have a substantially radial shape. In other embodiments, other shapes are also possible. Further, in other embodiments, the thermal spreading element 222 and the cooling channel 224 may have different shapes.

As illustrated in FIG. 2a, the thermal spreading element 222 is positioned between top surface 226 of cooling base 220 and cooling channel 224. In one embodiment, the thermal spreading element 224 is positioned closer to the top surface 226 than the cooling channel 224. In other embodiments, the thermal spreading element is positioned closer to the cooling channel 224 than the top surface 226. In yet other embodiments, the thermal spreading element 224 may be positioned at an equal distance from the top surface 226 and cooling channel 224.

Further, in one embodiment, the thermal spreading element 222 extends beyond one or more edges of puck 210. In another embodiment, the thermal spreading element 222 is aligned with one or more edges of puck 210. In yet other embodiments, one or more edges of puck 210 extend beyond the thermal spreading element 222. Further, the cooling channel 224 may extend beyond one or more edges of the puck 210, an edge of the cooling channel 224 may be aligned with an edge of the puck 210, or one or more edged of the puck 224 may extend outside one or more edges of the cooling channel 224.

Figure 2B:
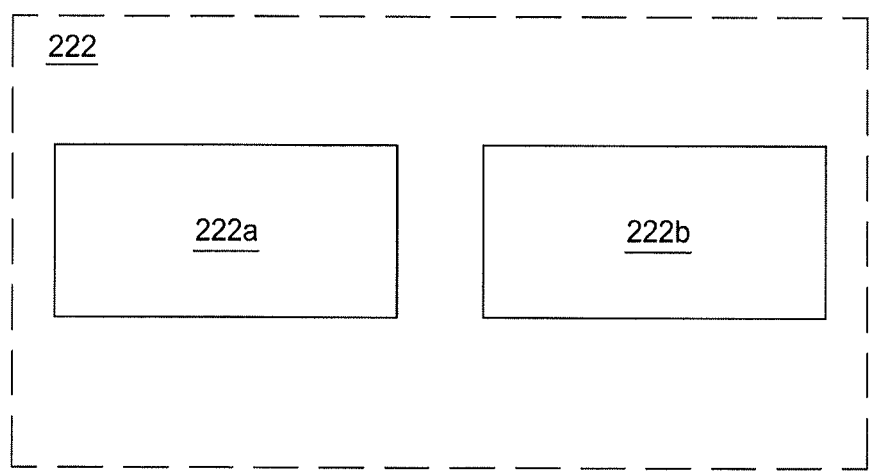
FIG. 2b is top view of a thermal spreading element of an electrostatic chuck assembly, according to one or more embodiments.

FIG. 2b illustrates a partial top view thermal spreading element 222. As illustrated thermal spreading element 222 comprises two discrete portions, portions 222a and 222b. While thermal spreading element 222 is illustrated as having two discrete portions, in other embodiments, the thermal spreading element 222 may have more than two discrete portions. In an embodiment, the thermal spreading element 222 includes a single and continuous portion. Further, each of the discrete portions may have at least one of a common size and common shape. In other embodiments, one or more of the discrete portions has a different size than at least one other discrete portion. Each of the discrete portions are separated from each other within the cooling base 220 by a rib (solid portion of cooling base 220) formed within cooling channel 220. The discrete portions of thermal spreading element 222 reduce the possibilities of deformation occurring within the cooling base 220 during processing of a substrate.

Figure 3A:
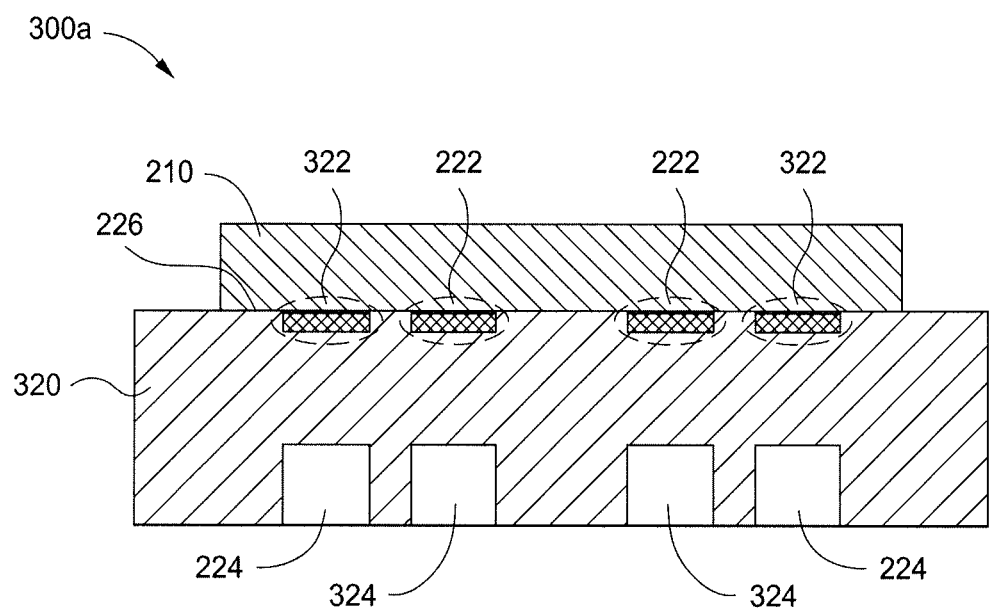
FIG. 3a is a sectional side view of an electrostatic chuck assembly, according to one or more embodiments.

FIG. 3a illustrates an embodiment of electrostatic chuck assembly 300a. As with the electrostatic chuck assembly 200, electrostatic chuck assembly 300a includes the puck 210 and cooling base 320. While not illustrated, the electrostatic chuck assembly 300a may be disposed on a substrate support. The substrate support may include an insulator and a ground plate. The cooling base 320 is similar to that of cooling base 220; however, cooling base includes two cooling channels and two corresponding thermal spreading elements. As illustrated in FIG. 3a, the cooling base 320 includes thermal spreading element 222 aligned with cooling channel 224 and thermal spreading element 322 aligned with cooling channel 324. The cooling channel 224 is isolated and controllable separately from the cooling channel 324 so that different regions of the puck 210 may have independent thermal control. The thermal spreading element 222 and the cooling channel 224 are located inward of the thermal spreading element 322 and the cooling channel 324. For example, the thermal spreading element 222 and the cooling channel 224 may be located in a center zone, while the thermal spreading element 322 and the cooling channel 324 may be located in an edge zone that is concentric with and radially outward of the center zone. Within the center zone, the thermal spreading element 222 and the cooling channel 224 may comprises one or more ring shaped elements. Similarly, the thermal spreading element 322 and the cooling channel 324 located in the edge zone may comprises one or more ring shaped elements. Optionally, each thermal spreading element 222, 322 may comprises at least two or more discrete portions. Thermal spreading elements 322 and corresponding cooling channel 324 are configured similar to thermal spreading element 222 and 224 as described with regard to FIGS. 2a and 2b.

Figure 3B:
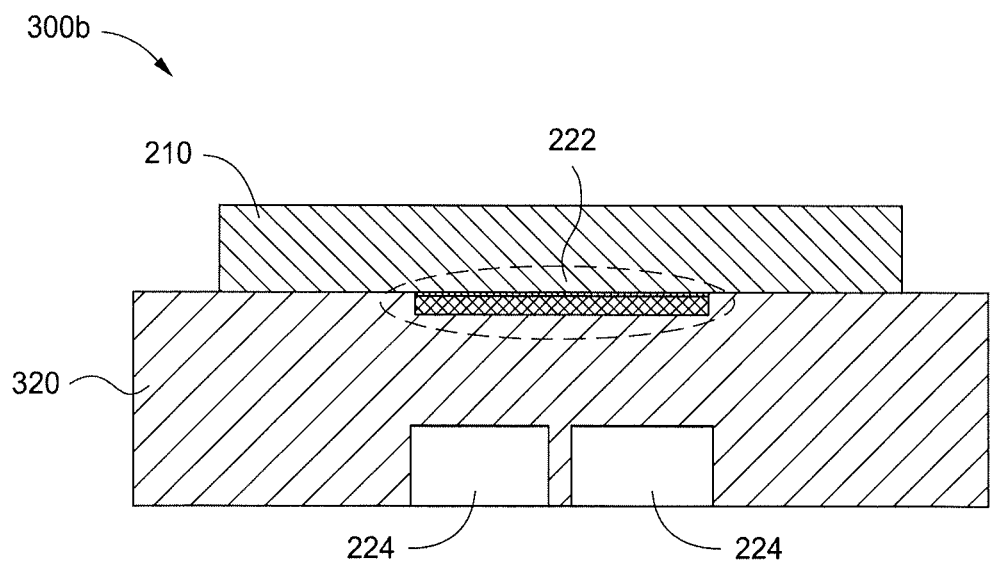
FIG. 3b is a partial sectional side view of a cooling base of an electrostatic chuck assembly, according to one or more embodiments.

FIG. 3b illustrates an alternative embodiment of electrostatic chuck assembly 300b having a cooling base 320 having at least one thermal spreading element 222 that spans across at least two corresponding cooling channels 224. Each cooling channel 224 flows fluid from the same fluid source to cool the base 320. Alternatively, the two cooling channels 224 shown in FIG. 3b may be loops of a single cooling channel. Using one thermal spreading element 222 to span the two cooling channels 224 assists equalizing the temperature transfer to the cooling channel 224 in instances where the temperature of the fluid within the channels 224 are not identical (for example, when one channel 224 is closer to the fluid outlet than the other channel 224) or when different head loads are provided across the top surface of the puck 210. The thermal spreading elements 222 and cooling channels 224 of FIG. 3b are configured similar to those of FIGS. 2a-b and 3a. In one or more embodiments, an electrostatic chuck assembly may include any number of thermal spreading elements and cooling channels. For example, an electrostatic chuck assembly may include 1, 2, 3, 4 or more thermal spreading elements and cooling channels. Further, in one or more embodiments, the number of thermal spreading elements may be greater than the number of cooling channels.

Figure 3C:
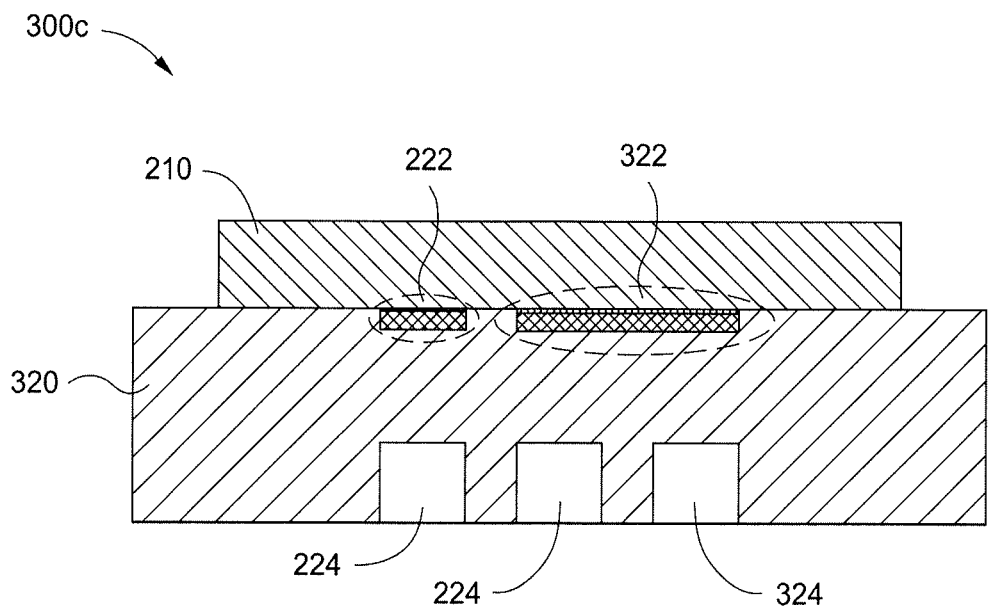
FIG. 3c is a partial sectional side view of a cooling base of an electrostatic chuck assembly, according to one or more embodiments.

FIG. 3c illustrates an alternative embodiment of electrostatic chuck assembly 300c having a cooling base 320 having at least two thermal spreading element 222 and 322. In the embodiment of FIG. 3c, thermal spreading element 222 spans across at least one corresponding cooling channel 224 and thermal spreading element 322 spans across at least two corresponding cooling channels 224 and 324. Each cooling channel 224 and 324 flows fluid from the same fluid source to cool the base 320. Alternatively, at least two cooling channels 224 and/or 324 shown in FIG. 3c may be loops of a single cooling channel. Using thermal spreading element 222 to span the cooling channel 224 and one thermal spreading element to span the cooling channels 224 and 324 assists equalizing the temperature transfer to the cooling channels 224 and 324 in instances where the temperature of the fluid within the channels 224 and 324 are not identical (for example, when one cooling channel closer to the fluid outlet than the another cooling channel 324) or when different head loads are provided across the top surface of the puck 210. Further, using a single thermal spreading element 222 to span a single cooling channel 224 allows for the thermal spreading element 222 to be individually tuned to the parameters of the corresponding cooling channel 224. This may include varying one of the height, width, and/or position of thermal spreading element 222 to assist in equalizing the temperature transfer to cooling channel 224. The thermal spreading elements 222 and 322 may be similar in size, shape, and/or position within cooling base 320. IN other embodiments, the thermal spreading elements 222 and 322 differ in at least one of size, shape, and/or position within cooling base 320. The thermal spreading elements 222 and 322 and the cooling channels 224 and 324 of FIG. 3c are configured similar to those of FIGS. 2a-b and 3a. In one or more embodiments, an electrostatic chuck assembly may include any number of thermal spreading elements and cooling channels. For example, an electrostatic chuck assembly may include 1, 2, 3, 4 or more thermal spreading elements and cooling channels. Further, in one or more embodiments, the number of thermal spreading elements may be greater than the number of cooling channels.

Figure 3D:
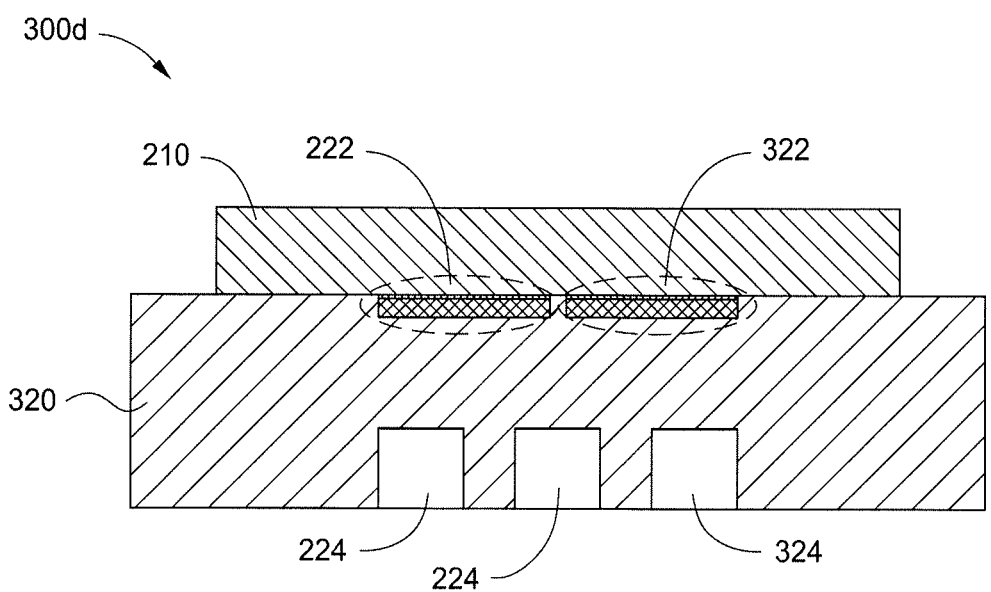
FIG. 3d is a partial sectional side view of a cooling base of an electrostatic chuck assembly, according to one or more embodiments.

FIG. 3d illustrates an alternative embodiment of electrostatic chuck assembly 300d having a cooling base 320 having at least two thermal spreading elements 222 and 322. In the embodiment of FIG. 3d, each of the thermal spreading element 222 spans across at two one corresponding cooling channels 224 and 324. Each cooling channel 224 and 324 flows fluid from the same fluid source to cool the base 320. Alternatively, at least two cooling channels 224 and/or 324 shown in FIG. 3d may be loops of a single cooling channel. Using the thermal spreading element 222 to span the cooling channels 224 and the thermal spreading element 322 to span cooling the cooling channels 224 and assists equalizing the temperature transfer to the cooling channels 224 and 324 in instances where the temperature of the fluid within the channels 224 and 324 are not identical (for example, when one cooling channel closer to the fluid outlet than the another cooling channel 324) or when different head loads are provided across the top surface of the puck 210. The thermal spreading elements 222 and 322 may be similar in size, shape, and/or position within cooling base 320. In other embodiments, the thermal spreading elements 222 and 322 differ in at least one of size, shape, and/or position within cooling base 320. The thermal spreading elements 222 and 322 and the cooling channels 224 and 324 of FIG. 3d are configured similar to those of FIGS. 2a-b and 3a. In one or more embodiments, an electrostatic chuck assembly may include any number of thermal spreading elements and cooling channels. For example, an electrostatic chuck assembly may include 1, 2, 3, 4 or more thermal spreading elements and cooling channels. Further, in one or more embodiments, the number of thermal spreading elements may be greater than the number of cooling channels.

Figure 4:
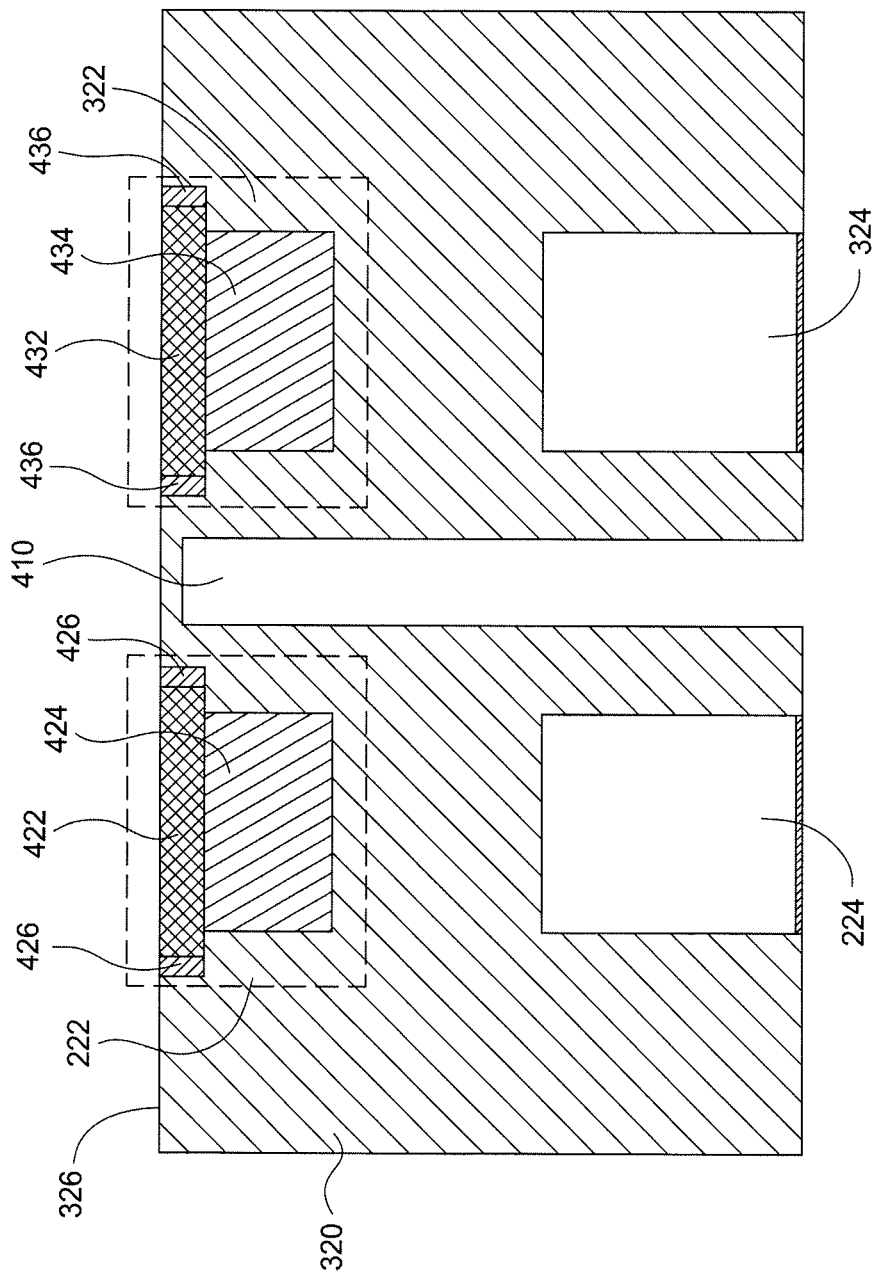
FIG. 4 is a sectional side view of a cooling base of an electrostatic chuck assembly, according to one or more embodiments.

FIG. 4 illustrates another embodiment of cooling base 320. As illustrated, cooling base 320 includes the thermal spreading elements 222 and 322 and cooling channels 222 and 322. Further, as is illustrated in FIG. 4, additionally includes thermal break 410. The thermal break 410 reduces thermal crosstalk, i.e., lateral heat transfer, within the cooling base 320. The thermal break 410 may be disposed between thermal spreading element 222 and cooling channel 324 and/or between thermal spreading element 322 and cooling channel 224. In one embodiment, the thermal break 410 eliminates thermal crosstalk between thermal spreading element 222 and cooling channel 324 and between thermal spreading element 322 and cooling channel 224. Thermal crosstalk corresponds to effects on a thermal spreading element from an unaligned cooling channel or channels. Thermal break 410 may include any material or combination of materials that will reduce crosstalk. For example, the thermal break 410 may include at least one material having a lower thermal conductivity than the material of cooling base 320. In one embodiment, the thermal break 410 includes air or another material having a coefficient of heat transfer much less than that of the bulk material of the cooling base 320 (e.g., aluminum). In one embodiment, the thermal break 410 includes a material or materials inserted within cooling base 410. Further, the thermal break 410 may be a slit with cooling base 410.

With further reference to FIG. 4, thermal spreading element 222 includes recess area 424 and cap 422, and thermal spreading element 322 includes recess area 434 and cap 432. A heat spreading material is disposed within the recess areas 424 and 434 and caps 422 and 432 are then positioned over the corresponding recess areas. The heat spreading material has a higher thermal conductivity than that of the material of the cooling base 320. Further, in various embodiments, the heat spreading material fills only a portion of each recess area or the entirety of each recess area. The height and/or position of the thermal spreading element may correspond to the amount of heat spreading material that is disposed within each recess area. For example, the heat spreading material maybe placed further away from the surface 326 by increasing the depth of a recess area and disposing the thermal spreading element material such that it only fills a portion of the recess area. The size and/or shape of each cap may be configured based on the depth of a recess area and the amount of thermal spreading element material positioned within the recess area.

In various embodiments, each cap seals the heat spreading material within each recess area. In some embodiments, each cap seals and compresses the heat spreading material within each recess area.

The caps 422 and 432 may be positioned over each recess area and adhered around the outside of each recess area (steps 426 and 436). In one embodiment, the discrete portions are separated by steps to which a cap or caps may be attached. In one more embodiments, the caps 422 and 432 are welded around the outside of each recess area. Further, each cap 422 and 432 may be positioned over corresponding recess areas such that the top of each cap is flush with top surface 326 of cooling base 320. In one embodiment, after caps 422 and 432 are welded in the steps 426 and 436, the top surface 326 and caps 422 and 432 may be machined to create a flat and continuous surface.

In one embodiment, each discrete portion of the thermal spreading elements may include a separate cap. In some embodiments, one or more discrete portions of a thermal spreading element are covered by a common cap. In yet other embodiments, a single cap covers all of the discrete portions of a thermal spreading element.

In the example depicted in FIG. 4, the thermal break 410 is shown extending between both the thermal spreading elements 222, 322 and cooling channels 224, 324. However in another example, the thermal break 410 extends only between the thermal spreading elements 222, 322. In yet another example, the thermal break 410 extends only between the cooling channels 224, 324.

Figure 5:
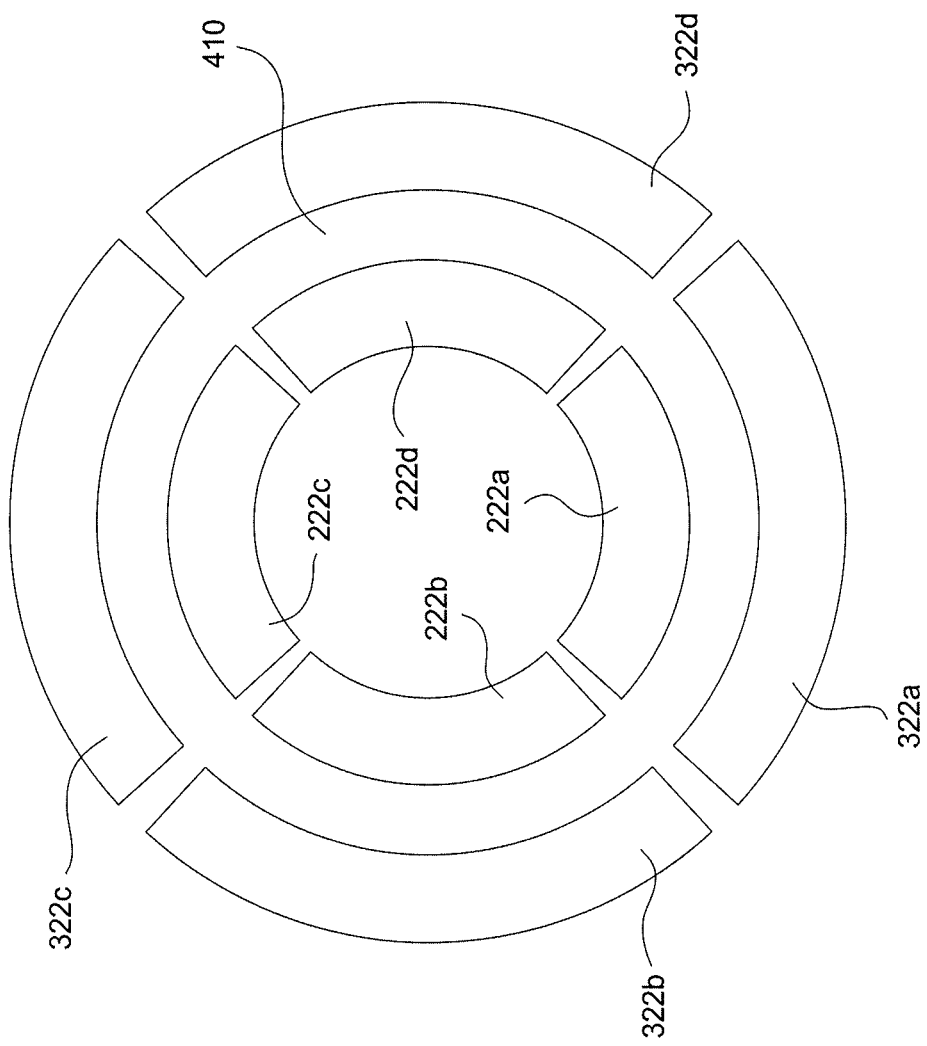
FIG. 5 is a tope view of a cooling base of an electrostatic chuck assembly, according to one or more embodiments.

FIG. 5 illustrates a top view of thermal spreading elements 222 and 322 and thermal break 410. As illustrated thermal spreading elements 222 and 322 have a ring-like shape. While not illustrated, corresponding cooling channels also have a similar ring-like shape. Thermal spreading element 222 includes discrete arc-shaped portions 222a-222d and thermal spreading element 322 includes discrete portions 322a-322d. Further, as illustrated, the thermal break 410 may be positioned between thermal spreading elements 222 and 322. In one embodiment, the thermal break 410 is continuous. In other embodiments, the thermal break 410 has multiple portions and the portions of the thermal break 410 may be aligned with the discrete portions of the thermal spreading elements. In yet another example, thermal breaks 410 may be disposed between the discrete arc-shaped portions 222a-222d and/or between the discrete arc-shaped portions 322a-322d.

In the embodiment illustrated in FIG. 5, each thermal spreading element includes the same number of discrete portions. However, in other embodiments at least one thermal spreading element has more discrete portions than the other. Further, in various embodiments, the discrete portions of each thermal spreading element (thermal spreading elements 222 and 322) may be aligned with either. In other embodiments, at least one discrete portion of thermal spreading element 222 is unaligned with a discrete portion of thermal spreading element 322. Further, the size and/or shape of the discrete portions of thermal spreading element 222 may the same as or different from the size and/or shape of the discrete portions of thermal spreading element 322.

While the foregoing is directed to specific embodiments, other and further embodiments may be devised without departing from the basic scope thereof, and the scope thereof is determined by the claims that follow.

What is claimed is:

1. An electrostatic chucking assembly comprising:
   a puck having a chucking electrode disposed therein; and
   a cooling base connected to the puck, the cooling base formed from a first material and comprising:
      a top surface;
      a first cooling channel;
      a second cooling channel configured to flow coolant therethrough independent of flow through the first cooling channel; and
      a first thermal spreading element aligned with the first cooling channel and disposed between the first cooling channel and the puck, the first thermal spreading element formed from a second material having a thermal conductivity higher than a thermal conductivity of the first material, wherein the first thermal spreading element comprises:
         a recess area formed within the top surface of the cooling base, wherein the second material is disposed within the recess area; and
         a cap disposed over the recess area.

2. The electrostatic chucking assembly of claim 1, wherein the cooling base further comprises:
   a second thermal spreading element aligned with the second cooling channel and disposed between the second cooling channel and the puck, the second thermal spreading element separate from the first thermal spreading element.

3. The electrostatic chucking assembly of claim 2, wherein the cooling base further comprises a thermal break between the first thermal spreading element and the second thermal spreading element.

4. The electrostatic chucking assembly of claim 3, wherein the thermal break comprises a third material having a thermal conductivity lower than the thermal conductivity of the first material.

5. The electrostatic chucking assembly of claim 1, wherein the cap is flush with the top surface of the cooling base.

6. The electrostatic chucking assembly of claim 1, wherein the first thermal spreading element comprises more than two discrete portions.

7. The electrostatic chucking assembly of claim 1, wherein the first material is aluminum and the second material is thermally annealed pyrolytic graphite (TPG).

8. The electrostatic chucking assembly of claim 1, wherein the first cooling channel is concentric with the second cooling channel.

9. The electrostatic chucking assembly of claim 1, wherein the first cooling channel and the first thermal spreading element comprise at least one of a common shape and common width.

10. An electrostatic chucking assembly comprising:
    a puck having a chucking electrode disposed therein; and
    a cooling base connected to the puck, the cooling base formed from a first material and comprising:
       a top surface;
       a first cooling channel;
       a second cooling channel configured to flow coolant therethrough independent of flow through the first cooling channel; and
       a first thermal spreading element aligned with the first cooling channel and disposed between the first cooling channel and the puck, the first thermal spreading element formed from a second material having a thermal conductivity higher than a thermal conductivity of the first material, wherein the first cooling channel and the first thermal spreading element comprise a ring-like shape.

11. A semiconductor processing chamber comprising:
    a chamber body;
    an electrostatic chucking assembly disposed in the chamber body, the electrostatic chucking assembly comprising:
       a puck having a chucking electrode disposed therein; and
       a cooling base connected to the puck, the cooling base formed from a first material and comprising:
          a top surface;
          a first cooling channel;
          a second cooling channel configured to flow coolant therethrough independent of flow through the first cooling channel; and
          a first thermal spreading element aligned with the first cooling channel and disposed between the first cooling channel and the puck, the first thermal spreading element formed from a second material having a thermal conductivity higher than a thermal conductivity of the first material, wherein the first cooling channel and the first thermal spreading element comprise one of a common shape and a common size; and a substrate support disposed in the chamber body and having the electrostatic chuck assembly disposed thereon.

12. The semiconductor processing chamber of claim 11, wherein the cooling base further comprises:

a second thermal spreading element aligned with the second cooling channel and disposed between the second cooling channel and the puck, the second thermal spreading element separate from the first thermal spreading element.

13. The semiconductor processing chamber of claim 12, wherein the first thermal spreading element further comprises a thermal break between the first and second thermal spreading elements.

14. The semiconductor processing chamber of claim 13, wherein the thermal break comprises a third material having a thermal conductivity lower than the thermal conductivity of the second material.

15. The semiconductor processing chamber of claim 11, wherein the first thermal spreading element comprises:

a recess area formed within the top surface of the cooling base, wherein the second material is disposed within the recess area; and a cap disposed on said recess area.

16. The semiconductor processing chamber of claim 15, wherein the cap is flush with the top surface of the cooling base.

17. The semiconductor processing chamber of claim 11, wherein the first thermal spreading element comprises more than two discrete portions.

18. The semiconductor processing chamber of claim 11, wherein the common shape is a ring-like shape.

* * * * *